(12) United States Patent
Lee et al.

(10) Patent No.: US 11,417,717 B2
(45) Date of Patent: Aug. 16, 2022

(54) PARTIAL TRANSPARENT DISPLAY DEVICE INCLUDING TRANSPARENT EMISSION AREA AND DRIVING EMISSION AREA

(71) Applicant: LG Display Co., Ltd., Seoul (KR)

(72) Inventors: Donghyun Lee, Paju-si (KR); Chui Nam, Paju-si (KR); Hyuck Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 360 days.

(21) Appl. No.: 16/706,381

(22) Filed: Dec. 6, 2019

(65) Prior Publication Data

US 2020/0194532 A1 Jun. 18, 2020

(30) Foreign Application Priority Data

Dec. 13, 2018 (KR) .................. 10-2018-0161048

(51) Int. Cl.
| | | |
|---|---|---|
| *H01L 27/14* | (2006.01) | |
| *H01L 27/32* | (2006.01) | |
| *H01L 51/00* | (2006.01) | |
| *G09G 3/3266* | (2016.01) | |
| *H01L 27/12* | (2006.01) | |
| *G09G 3/3233* | (2016.01) | |

(52) U.S. Cl.
CPC ....... *H01L 27/3276* (2013.01); *G09G 3/3266* (2013.01); *H01L 27/3248* (2013.01); *H01L 51/0096* (2013.01); *G09G 3/3233* (2013.01); *G09G 2300/0439* (2013.01); *H01L 27/124* (2013.01); *H01L 27/3234* (2013.01); *H01L 27/3246* (2013.01)

(58) Field of Classification Search
CPC .................................................. H01L 27/3276
See application file for complete search history.

(56) References Cited

U.S. PATENT DOCUMENTS

| | | | |
|---|---|---|---|
| 10,068,525 B2* | 9/2018 | Shin ................. | H01L 51/5203 |
| 2004/0140758 A1* | 7/2004 | Raychaudhuri ..... | H01L 51/5088 |
| | | | 313/504 |
| 2007/0007515 A1* | 1/2007 | Suh ................... | H01L 27/3246 |
| | | | 257/40 |

(Continued)

FOREIGN PATENT DOCUMENTS

| KR | 10-2017-0024182 A | 3/2017 |
|---|---|---|
| KR | 10-2017-0113066 A | 10/2017 |

*Primary Examiner* — Caleb E Henry
(74) *Attorney, Agent, or Firm* — Fenwick & West LLP

(57) ABSTRACT

A partial transparent display device has a light transmitting function and a light emitting function in one area. The partial transparent display device includes a substrate, a transparent emission area, a driving emission area, and a pad part. The transparent emission area is disposed to be adjacent to one side of the substrate. The driving emission area is disposed to be adjacent to the transparent emission area and to be closer to the other side opposite to the one side. The pad part extends from the driving emission area and is disposed on the other side. The driving emission area includes driving emission pixels which are defined by scan lines, data lines, and pixel driving power supply lines. The transparent emission area includes transparent emission pixels which are defined without the scan lines, the data lines, and the pixel driving power supply lines.

20 Claims, 7 Drawing Sheets

(56) References Cited

U.S. PATENT DOCUMENTS

| | | | |
|---|---|---|---|
| 2007/0162074 A1* | 7/2007 | Bartlett | A61B 17/0401 606/232 |
| 2008/0174709 A1* | 7/2008 | Lim | H01L 27/1255 445/47 |
| 2011/0109612 A1* | 5/2011 | Chaji | G09G 3/3225 345/211 |
| 2015/0102316 A1* | 4/2015 | Park | H01L 51/5203 257/40 |
| 2015/0311265 A1* | 10/2015 | Matsueda | H01L 27/3211 257/89 |
| 2015/0364530 A1* | 12/2015 | Yoon | H01L 27/3276 257/40 |
| 2016/0093679 A1* | 3/2016 | Moon | H01L 27/326 257/40 |
| 2016/0329387 A1* | 11/2016 | Mohan | H01L 51/5012 |
| 2017/0062535 A1* | 3/2017 | Kim | H01L 27/3246 |
| 2017/0069871 A1* | 3/2017 | Yim | H01L 51/5234 |
| 2017/0084635 A1* | 3/2017 | Jung | H01L 29/78675 |
| 2017/0179441 A1* | 6/2017 | Lee | H01L 51/5268 |
| 2018/0108677 A1* | 4/2018 | Yeh | H01L 27/1262 |
| 2019/0205596 A1* | 7/2019 | Kim | G06V 10/147 |

\* cited by examiner

PARTIAL TRANSPARENT DISPLAY DEVICE INCLUDING TRANSPARENT EMISSION AREA AND DRIVING EMISSION AREA

CROSS-REFERENCE TO RELATED APPLICATIONS

This application claims the benefit of Republic of Korea Patent Application No. 10-2018-0161048 filed on Dec. 13, 2018, which is hereby incorporated by reference as if fully set forth herein.

BACKGROUND

Field of the Disclosure

The present disclosure relates to a partial transparent display device having a light transmitting function and a light emitting function in a predetermined area. Particularly, the present disclosure relates to an electroluminescence (EL) display device in which a transparent emission area including a transparent area and an emission area is disposed in a part and a driving emission area including a driving element and an emission area is disposed in the other part.

Discussion of the Related Art

An EL display device employs a spontaneous emission system, has a viewing angle, a contrast ratio, and the like which are excellent, and can be decreased in weight and thickness and is advantageous in power consumption because a separate backlight is not required. Particularly, an organic light emitting display (OLED) device out of such EL display devices can be driven with a low DC voltage, has a high response speed, and has low manufacturing costs.

An EL display device includes a plurality of electroluminescence (EL) diodes. An EL diode includes an anode electrode, a light emitting layer that is formed on the anode electrode, and a cathode electrode that is formed on the light emitting layer. When a high-potential voltage is applied to the anode electrode and a low-potential voltage is applied to the cathode electrode, holes in the anode electrode and electrons in the cathode electrode move to the lighting emitting layer. When holes and electrons are coupled in the light emitting layer, excitons are formed in the course of excitation and light is generated due to energy from the excitons. An EL display device displays an image by electrically controlling a quantity of light which is generated in the light emitting layers of a plurality of EL diodes which are individually partitioned by banks.

An EL display device can be much decreased in thickness and has excellent flexibility, and is applied to various products in various fields. Demand for a transparent display device that provides both a background and a display function has increased. For example, in a mobile phone, a camera or an infrared sensor is disposed in a bezel area not having a display function and serve as main major factors for decrease in a ratio of a display area. There is demand for a display device with a new structure including a small camera or optical sensor and having a display area maximized in a front view.

SUMMARY

The present disclosure provides an electroluminescence (EL) display device having a display area increased by disposing an additional unit, which receives light through a substrate such as a camera, in the display area. The present disclosure also provides a partial transparent EL display device in which a part of a display panel has a function of transmitting a background and a display function and the other part has only a display function.

According to the present disclosure, there is provided a partial transparent electroluminescence (EL) display device including a substrate, a transparent emission area, a driving emission area, and a pad part. The transparent emission area is disposed to be adjacent to one side of the substrate. The driving emission area is disposed to be adjacent to the transparent emission area and to be closer to the other side opposite to the one side. The pad part extends from the driving emission area and is disposed on the other side. The driving emission area includes driving emission pixels which are defined by scan lines, data lines, and pixel driving power supply lines. The transparent emission area includes transparent emission pixels which are defined without the scan lines, the data lines, and the pixel driving power supply lines.

For example, the data lines and the pixel driving power supply lines may extend from the driving emission area to the pad part. The pad part may include data pads connected to the data lines and pixel driving power supply pads connected to the pixel driving power supply lines.

For example, a gate driving unit connected to the scan lines may be further disposed on at least one side of a right side and a left side of the driving emission area.

For example, each of the driving emission pixel may include a first driving thin-film transistor, a second driving thin-film transistor, and a first light emitting element. The first driving thin-film transistor may be connected to a first scan line, the corresponding data line, and the corresponding pixel driving power supply line. The second driving thin-film transistor may be connected to a second scan line, the corresponding data line, and the corresponding pixel driving power supply line. The first light emitting element may be connected to the first driving thin-film transistor. The transparent emission pixel may include a second light emitting element and a transparent area. The second light emitting element may be connected to the second driving thin-film transistor. The transparent area may transmit light which is incident from a rear surface of the substrate.

For example, the driving emission pixels may have the same shape and size as the transparent emission pixels. The first light emitting element may have the same shape and size as the second light emitting element.

For example, the first light emitting element may include a first pixel driving electrode and a first light emitting layer. The first pixel driving electrode may be connected to the first driving thin-film transistor. The first light emitting layer may be stacked on the first pixel driving electrode. The second light emitting element may include a second pixel driving electrode and a second light emitting layer. The second pixel driving electrode may be connected to the second driving thin-film transistor. The second light emitting layer may be stacked on the second pixel driving electrode. A common electrode may be stacked on the first light emitting layer and the second light emitting layer.

For example, the second light emitting element may be connected to the second driving thin-film transistor by a connection electrode that extends from the pixel driving electrode to the driving emission pixel.

According to the present disclosure, there is provided a partial transparent display device including transparent emission pixels, driving emission pixels, and light emitting elements. The transparent emission pixels include m transparent emission pixels (where m is an natural number) that are arranged in a column direction in one side of a substrate. The driving emission pixels include n driving emission pixels (where n is a natural number equal to or less than m) that are arranged in the column direction to be adjacent to the final transparent emission pixel. The light emitting elements include k light emitting elements (where k is a natural of (m+n)) that are arranged in the transparent emission pixels and the driving emission pixels, respectively. The m transparent emission pixels may include transparent areas that are disposed around the light emitting elements. Here, k pixel circuits may be distributed to and disposed in the n driving emission pixels. The k pixel circuits may be sequentially connected to the k light emitting elements.

For example, the transparent emission pixels and the driving emission pixels may have the same size and shape.

For example, the partial transparent display device may further include a plurality of standard emission pixels that are arranged in the column direction to be adjacent to the final driving emission pixel.

For example, the standard emission pixels may be disposed with a first pixel density. Each of the driving emission pixels and the transparent emission pixels may be disposed with a second pixel density which is less than the first pixel density.

For example, the first pixel density may be two or more times the second pixel density in at least one direction of the column direction and a row direction which is perpendicular to the column direction.

For example, each of the standard emission pixels may include one standard pixel circuit and one standard light emitting element. The size of each of the standard emission pixel may correspond to an area which is occupied by one pixel circuit disposed in each driving emission pixel.

For example, the driving emission pixels and the standard emission pixels may be defined by a plurality of scan lines, a plurality of data lines, and a plurality of pixel driving power supply lines. The k pixels circuits may be connected to k continuous scan lines of the plurality of scan lines, the corresponding data lines, and the corresponding pixel driving power supply lines. Each of the standard pixel circuits may be connected one scan line other than the k continuous scan lines, the corresponding data line, and the corresponding pixel driving power supply line.

For example, the partial transparent display device may further include a pad part and a gate driving unit. The pad part may be disposed outside the final standard emission pixel in the column direction and include data pads connected to the data lines and pixel driving power supply pads connected to the pixel driving power supply lines. The gate driving unit may be disposed on at least one side of a right side and a left side of the driving emission pixels and the standard emission pixels and be connected to the scan lines.

For example, the partial transparent display device may further include link electrodes that link the pixel circuits and the light emitting elements. The link electrodes may be disposed on one side of the transparent emission pixels to bypass and surround the light emitting elements.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

DETAILED DESCRIPTION OF THE DISCLOSURE

Figure 1:
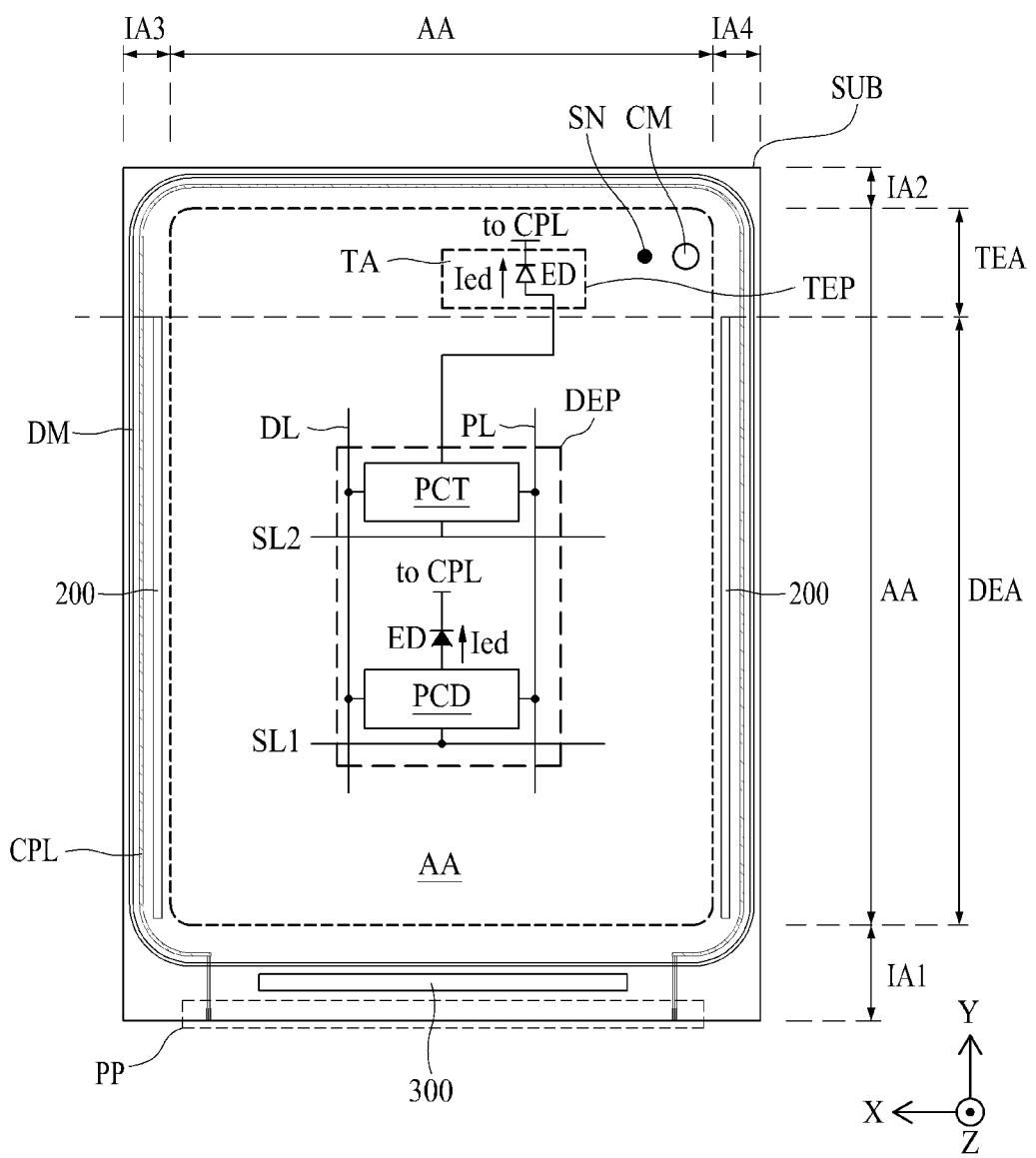
FIG. 1 is a plan view illustrating a partial transparent electroluminescence (EL) display device according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise,' 'have,' and 'include' described in the present specification are used, another part may be added unless 'only-' is used. The terms of a singular form may include plural forms unless referred to the contrary.

In construing an element, the element is construed as including an error range although there is no explicit description.

In describing a positional relationship, for example, when a position relation between two parts is described as 'on~,' 'over~,' 'under~,' and 'next~,' one or more other parts may be disposed between the two parts unless 'just' or 'direct' is used.

In describing a temporal relationship, for example, when the temporal order is described as 'after~,' 'subsequent~,' 'next~,' and 'before~,' a case which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

A partial transparent display device according to the present disclosure will be described below. An example of a partial transparent electroluminescence (EL) display device which is an electroluminescence (EL) display device having a partial light transmitting function applied thereto will be described below with reference to the accompanying drawings. In the drawings, the same elements will be referred to by the same reference signs as much as possible.

Hereinafter, a partial transparent display device according to an exemplary embodiment of the present disclosure will be described in detail with reference to the drawings. FIG. 1 is a plan view illustrating a partial transparent electroluminescence (EL) display device according to an exemplary embodiment of the present disclosure. Referring to FIG. 1, a partial transparent display device according to the present disclosure includes a transparent emission area TEA and a driving emission area DEA.

The transparent emission area TEA refers to an area that has a light transmitting function of transmitting light on the rear surface to the front surface and that has a display function in addition to or instead of the light transmitting function. The driving emission area DEA refers to an area that has a display function and includes driving elements that drive light emitting elements in the driving emission area DEA and the transparent emission area TEA. In the transparent emission area TEA, for example, metal lines and driving elements are not disposed or a minimum number of lines and elements are disposed. Accordingly, it is preferable that driving elements for the display function of the transparent emission area TEA in addition to driving elements for the display function be disposed in the driving emission area DEA.

The partial transparent display device according to an exemplary embodiment of the present disclosure includes a substrate SUB, a transparent emission area TEA, transparent emission pixels TEP, a driving emission area DEA, driving emission pixels DEP, a common power supply line CPL, a dam structure DM, a pad part PP, and driving units 200 and 300.

The substrate SUB serves as a base substrate (or a base layer) and is formed of a plastic material or a glass material. The substrate SUB is preferably transparent in view of characteristics of a display device. In some cases, for example, in case of a top emission system, the substrate SUB may be formed of an opaque material.

For example, the substrate SUB may two-dimensionally have a quadrangular shape, a quadrangular shape of which corners are rounded with a predetermined radius of curvature, or a non-quadrangular shape having at least six sides. Here, the substrate SUB having a non-quadrangular shape includes at least one protruding portion or at least one notched portion.

For example, the substrate SUB may be partitioned into a display area AA and a non-display area IA. The display area AA is provided in a substantially middle part of the substrate SUB and is defined as an area for displaying an image. For example, the display area AA has a quadrangular shape, a quadrangular shape of which corners are rounded with a predetermined radius of curvature, or a non-quadrangular shape having at least six sides. Here, the display area AA having a non-quadrangular shape includes at least one protruding portion or at least one notched portion.

The non-display area IA is provided in edges of the substrate SUB to surround the display area AA and is defined as an area in which an image is not displayed or a circumferential area. For example, the non-display area IA includes a first non-display area IA1 that is provided at a first edge of the substrate, a second non-display area IA2 that is provided at a second edge of the substrate SUB which is parallel to the first non-display area IA1, a third non-display area IA3 that is provided at a third edge of the substrate SUB, and a fourth non-display area IA4 that is provided at a fourth edge of the substrate SUB which is parallel to the third non-display area IA3. For example, the first non-display area IA1 may be an upper (or lower) edge area of the substrate SUB, the second non-display area IA2 may be a lower (or upper) edge area of the substrate SUB, the third non-display area IA3 may be a left (or right) edge area of the substrate SUB, and the fourth non-display area IA4 may be a right (or left) edge area of the substrate SUB, but the present disclosure is not limited thereto.

The display area AA is partitioned into two areas. Particularly, the display area AA is partitioned into an upper area and a lower area along a Y axis of an X-Y plane. For example, the upper area in which a camera CM or an optical sensor SN is mounted is defined as a transparent emission area TEA, and the other lower area is defined as a driving emission area DEA. A pad part PP is disposed below the driving emission area DEA. The pad part PP is a part which is supplied with driving signals for displaying an image in the transparent emission area TEA and the driving emission area DEA from the outside.

The transparent emission area TEA has a light emitting function and a light transmitting function and thus preferably includes light emitting elements and a transparent area. In order to secure the transparent area as wide as possible, it is preferable that lines other than the light emitting elements not be disposed therein. Accordingly, it is preferable that lines extending from the pad part PP be disposed in the driving emission area DEA but not be disposed in the transparent emission area TEA.

A plurality of driving emission pixels DEP are arranged in a matrix type in the driving emission area DEA. For example, the driving emission pixels DEP are defined by scan lines SL, data lines DL, and pixel driving power supply lines PL.

The scan lines SL extend in a first direction X and are disposed at predetermined intervals in a second direction Y crossing the first direction X. The display area AA of the substrate SUB includes a plurality of scan lines SL that are parallel to each other in the first direction X and are separated from each other in the second direction Y. Here, the first direction X is defined as a horizontal direction of the substrate SUB and the second direction Y is defined as a vertical direction of the substrate SUB, but the present disclosure is not limited thereto and may be defined on the contrary thereto.

The data lines DL extend in the second direction Y and are disposed at predetermined intervals in the first direction X. The display area AA of the substrate SUB includes a plurality of data lines DL that are parallel to the second direction Y and are separated from each other in the first direction X.

The pixel driving power supply lines PL are disposed on the substrate SUB to be parallel to the data lines DL. The display area AA of the substrate SUB includes a plurality of pixel driving power supply lines PL that are parallel to the data lines DL. Selectively, the pixel driving power supply lines PL may be disposed to be parallel to the scan lines SL.

A transparent emission pixel circuit PCT controls a current Ied flowing from the corresponding pixel driving power supply line PL to the corresponding light emitting element ED on the basis of a data voltage which is supplied from the corresponding data line DL in response to a scan signal which is supplied from a first scan line SL1. Here, the transparent emission pixel circuit PCT is connected to the light emitting element ED of a transparent emission pixel TEP disposed in the transparent emission area TEA.

A driving emission pixel circuit PCD controls a current Ied flowing from the corresponding pixel driving power supply line PL to the corresponding light emitting element ED on the basis of a data voltage which is supplied from the corresponding data line DL in response to a scan signal which is supplied from a second scan line SL2. Here, the driving emission pixel circuit PCD is connected to the light emitting element ED of a driving emission pixel DEP disposed in the driving emission area DEA.

A plurality of transparent emission pixels TEP are arranged in a matrix type in the transparent emission area TEA. Mechanisms such as a camera CM and an optical sensor SN are mounted on the rear surface of the substrate SUB to correspond to a part of the substrate SUB through which light is transmitted from the front surface to the rear surface. Each transparent emission pixel TEP has a fixed size and a light emitting element ED is disposed therein. The light emitting element ED occupies a part of the transparent emission pixel TEP. A part other than the part occupied by the light emitting element ED in the transparent emission pixel TEP is a transparent area TA.

The light emitting elements ED are disposed in a uniform distribution in the transparent emission area TEA and the driving emission area DEA. For example, pixels with the same size are arranged in a matrix type and one light emitting element is allocated to each pixel. On the other hand, since the pixel circuits are disposed in only the driving emission area DEA, two or more pixel circuits are disposed in each driving emission pixel DEP. That is, two or more pixel circuits are disposed in each driving emission pixel DEP, and each transparent emission pixel TEP does not include a pixel circuit.

Only light emitting elements ED are disposed in the transparent emission pixels TEP in the transparent emission area TEA, and the transparent emission pixel circuits PCT for driving the light emitting elements ED are disposed in the driving emission pixels DEP in the driving emission area DEA. On the other hand, each driving emission pixel DEP in the driving emission area DEA includes a light emitting element ED and a driving emission pixel circuit PCD for driving the light emitting element ED.

Here, the transparent emission pixel TEP and the driving emission pixel DEP are collectively referred to as a pixel. The transparent emission pixel circuit PCT and the driving emission pixel circuit PCD are collectively referred to as a pixel circuit.

For example, the pixels may be disposed in a stripe pattern in the display area AA. In this case, one unit pixel includes a red subpixel, a green subpixel, and a blue subpixel, and the unit pixel may further include a white subpixel.

For example, the pixels may be disposed in a pentile structure in the display area AA. In this case, a unit pixel includes at least one red subpixel, at least two green subpixels, and at least one blue subpixel which are disposed in a two-dimensional polygonal shape. For example, in one unit pixel having a pentile structure, one red subpixel, two green subpixels, and one blue subpixel are two-dimensionally disposed in an octagonal shape. In this case, the blue subpixel has an opening area (or an emission area) which is the largest, and the green subpixel has an opening area which is the smallest.

For example, each pixel circuit includes at least two thin-film transistors and one capacitor. For example, each pixel circuit PC may include a driving thin-film transistor that supplies a data current Ied based on a data voltage to the light emitting element ED, a switching thin-film transistor that supplies the data voltage supplied from the data line DL to the driving thin-film transistor, and a capacitor that stores a gate-source voltage of the driving thin-film transistor.

For example, each pixel circuit may include at least three thin-film transistors and at least one capacitor. For example, the pixel circuit PC includes a current supply circuit, a data supply circuit, and a compensation circuit depending on operations (or functions) of the at least three thin-film transistors. Here, the current supply circuit includes a driving thin-film transistor that supplies a data current Ied based on a data voltage to the light emitting element ED. The data supply circuit includes at last one switching thin-film transistors that supply the data voltage supplied form the data line DL to the current supply circuit in response to at least one scan signal. The compensation circuit includes at least one compensation thin-film transistor that compensates for change in characteristic values (a threshold voltage and/or mobility) of the driving thin-film transistor in response to at least one scan signal.

Each light emitting element ED emits light with luminance corresponding to the data current Ied in response to the data current Ied which is supplied from the pixel circuit PC. In this case, the data current Ied flows from the pixel driving power supply line PL to a common power supply line CPL via the light emitting element ED.

The light emitting elements ED disposed in the transparent emission area TEA and the light emitting elements ED disposed in the driving emission area DEA may have the same structure. For example, each light emitting element ED includes a pixel driving electrode (or a first electrode or an anode) that is electrically connected to a pixel circuit PC, a light emitting layer that is formed on the pixel driving electrode AE, and a common electrode (or a second electrode or a cathode) that is electrically connected to the light emitting layer EL.

The common power supply line CPL is disposed in the non-display area IA of the substrate SUB and is electrically connected to the common electrode disposed in the display area AA. For example, the common power supply line CPL is disposed along the second to fourth non-display areas IA2, IA3, and IA4 which are adjacent to the display area AA of the substrate SUB with a constant line width, and surrounds parts of the display area AA other than the part adjacent to the first non-display area IA1 of the substrate SUB. One end of the common power supply line CPL is disposed on one side of the first non-display area IA1 and the other end of the common power supply line CPL is disposed on the other side of the first non-display area IA1. One end and the other end of the common power supply line CPL are disposed to surround the second to fourth non-display areas IA2, IA3, and IA4. Accordingly, the common power supply line CPL has two-dimensionally a "n-shape" in which one side corresponding to the first non-display area IA1 of the substrate SUB is open.

An encapsulation layer is formed on the substrate SUB to surround the display area AA and the top surface and the side surface of the common power supply line CPL. On the other hand, the encapsulation layer exposes one end and the other end of the common power supply line CPL in the first non-display area IA1. The encapsulation layer serves to prevent oxygen or moisture from permeating the light emitting elements ED which are disposed in the display area AA. For example, the encapsulation layer may include at least one inorganic film. For example, the encapsulation layer may include a plurality of inorganic films and an organic film interposed between the pluralities of inorganic films.

A driving unit according to an embodiment of the present disclosure includes a gate driving circuit 200 and a driving integrated circuit 300.

The gate driving circuit 200 is provided in the third non-display area IA3 and/or the fourth non-display area IA4 of the substrate SUB and is connected to the scan lines SL provided in the display area AA in an one-to-one correspondence manner. The gate driving circuit 200 is formed as an integrated circuit in the third non-display area IA3 and/or the fourth non-display area IA4 of the substrate SUB in the same process as a process of manufacturing the pixels P, that is, a process of manufacturing the thin-film transistors. The gate driving circuit 200 drives a plurality of scan lines SL in a predetermined order by generating a scan signal on the basis of a gate control signal supplied from the driving integrated circuit 300 and outputting the generated scan signals in a predetermined order. For example, the gate driving circuit 200 may include a shift register.

The pad part PP includes a plurality of pads which are provided in the non-display area IA of the substrate SUB. For example, the pad part PP may include a plurality of common power supply pads, a plurality of data input pads, a plurality of power supply pads, and a plurality of control signal input pads which are provided in the first non-display area IA1 of the substrate SUB.

A dam structure DM is provided in the first non-display area IA1, the second non-display area IA2, the third non-display area IA3, and the fourth non-display area IA4 of the substrate SUB and has a closed curve structure surrounding the display area AA. For example, the dam structure DM is disposed outside the common power supply line CPL and is located in the outermost part on the substrate SUB.

The dam structure DM is disposed in the outermost part in FIG. 1, but the present disclosure is not limited thereto. For example, the dam structure DM may be disposed between the common power supply line CPL and the gate driving circuit 200. For example, the dam structure DM may be disposed between the display area AA and the driving integrated circuit 300.

The driving integrated circuit 300 is mounted in a chip mounting area which is defined in the first non-display area IA1 of the substrate SUB through a chip mounting (or bonding) process. Input terminals of the driving integrated circuit 300 are electrically connected to the pad part PP and thus are electrically connected to a plurality of data lines DL provided in the display area AA and a plurality of pixel driving power supply lines PL. The driving integrated circuit 300 receives various powers, a timing synchronization signal, and digital image data from a display driving circuit unit (or a host circuit) via the pad part PP, generates gate control signals on the basis of the timing synchronization signal, controls driving of the gate driving circuit 200, converts the digital image data into analog pixel data voltages, and supplies the analog pixel data voltages to the corresponding data lines DL.

Figure 2:
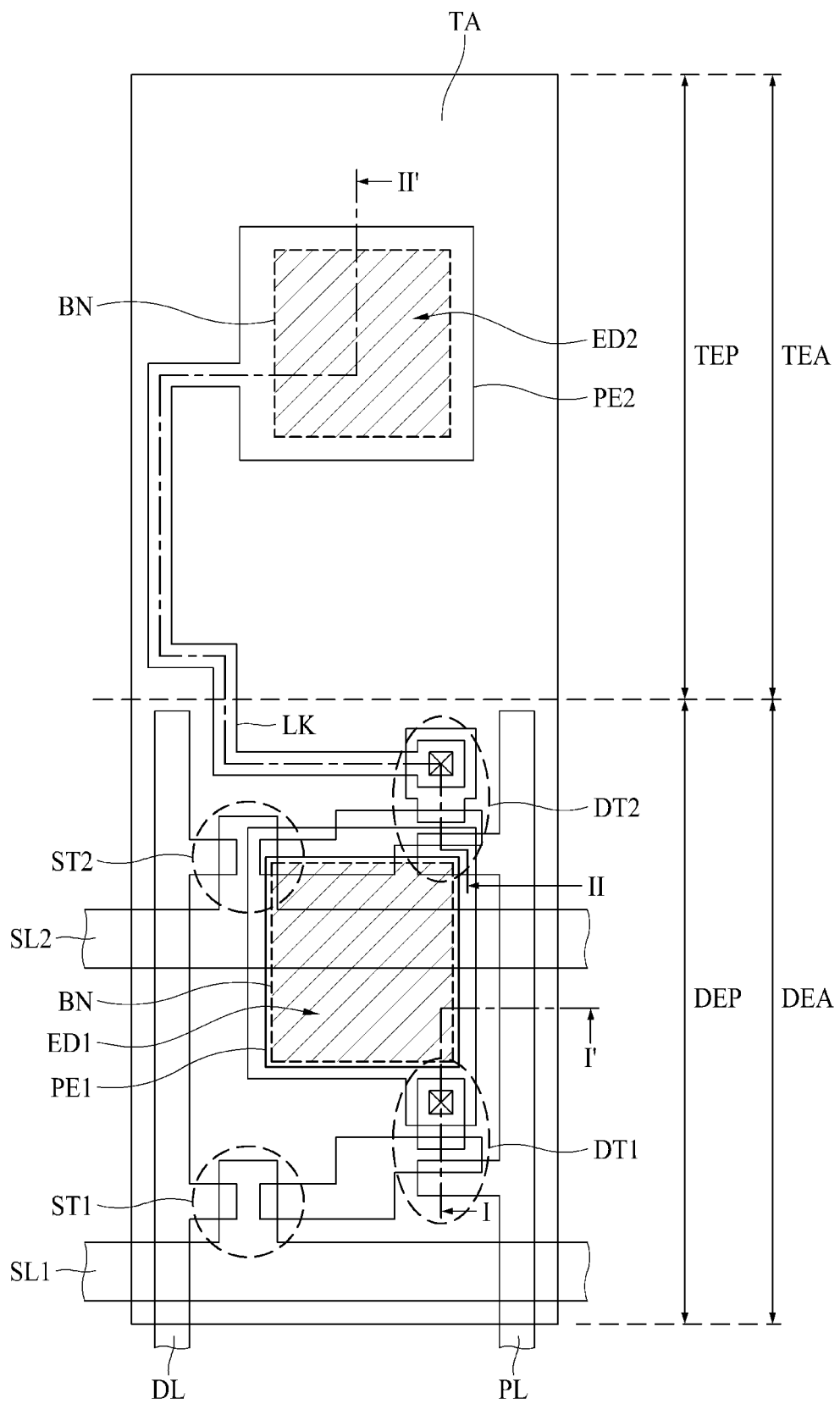
FIG. 2 is an enlarged plan view illustrating a pixel structure of a unit in the partial transparent EL display device according to the embodiment of the present disclosure.

A basic pixel structure constituting a partial transparent EL display device according to an embodiment of the present disclosure will be described below in detail with reference to FIGS. 2 to 4. A basic unit pixel structure will be first described below with reference to FIG. 2. FIG. 2 is an enlarged plan view illustrating a pixel structure of a basic unit in the partial transparent EL display device according to the embodiment of the present disclosure.

For the purpose of convenience of explanation and understanding, it is assumed that two pixel areas are provided in one column of pixels constituting a display device in FIG. 2. However, the present disclosure is not limited thereto. Referring to FIG. 2, a partial transparent display device according to an embodiment of the present disclosure includes a transparent emission area TEA and a driving emission area DEA.

One transparent emission pixel TEP is disposed in the transparent emission area TEA, and one driving emission pixel DEP is disposed in the driving emission area DEA. It is preferable that the transparent emission pixel TEP and the driving emission pixel DEP have the same shape and the same size. However, in some cases, they may have different sizes and different shapes.

The driving emission pixel DEP includes a first scan line SL1, a second scan line SL2, a data line DL, a pixel driving power supply line PL, a first switching thin-film transistor ST1, a first driving thin-film transistor DT1, a second switching thin-film transistor ST2, a second driving thin-film transistor DT2, and a first light emitting element ED1.

The first switching thin-film transistor ST1 is connected to the first scan line SL1 and the data line DL. The first driving thin-film transistor DT1 is connected to the first switching thin-film transistor ST1 and the pixel driving power supply line PL. A pixel electrode PE1 is connected to the first driving thin-film transistor DT1. The most area at the center of the first pixel electrode PE1 is defined as an emission area by a bank BN. A light emitting layer and a common electrode are stacked in the emission area to form the first light emitting element ED1.

The second switching thin-film transistor ST2 is connected to the second scan line SL2 and the data line DL. The second driving thin-film transistor DT2 is connected to the second switching thin-film transistor ST2 and the pixel driving power supply line PL. A link electrode LK is connected to the second driving thin-film transistor DT2.

The transparent emission pixel TEP includes a second pixel electrode PE2 and a transparent area TA. The second pixel electrode PE2 is connected to the second driving thin-film transistor DT2 disposed in the driving emission pixel DEP via the link electrode LK. The transparent area TA is a transparent area surrounding the second pixel electrode PE2. The most area at the center of the second pixel electrode PE2 is defined as an emission area by the bank BN.

A light emitting layer and a common electrode are stacked in the emission area to form the second light emitting element ED2.

It is preferable that the transparent area TA occupy the maximum area ratio of the transparent emission pixel TEP. Only the second light emitting element ED2 and a part of the link electrode LK are disposed in the transparent emission pixel TEP, and all driving elements for driving the second light emitting element ED2 are disposed in the driving emission pixel DEP. Specifically, the second scan line SL2, the data line DL, and the pixel driving power supply line PL may not be disposed in the transparent emission pixel TEP.

A sectional structure of a pixel in the partial transparent display device according to the present disclosure will be described below in detail with reference to FIGS. 3 and 4. FIG. 3 is a sectional view taken along line I-I' in FIG. 2 and illustrating a structure of a driving emission pixel in the partial transparent EL display device according to an embodiment of the present disclosure. FIG. 4 is a sectional view taken along line II-II' in FIG. 2 and illustrating a structure of a transparent emission pixel in the partial transparent EL display device according to the embodiment of the present disclosure.

Figure 3:
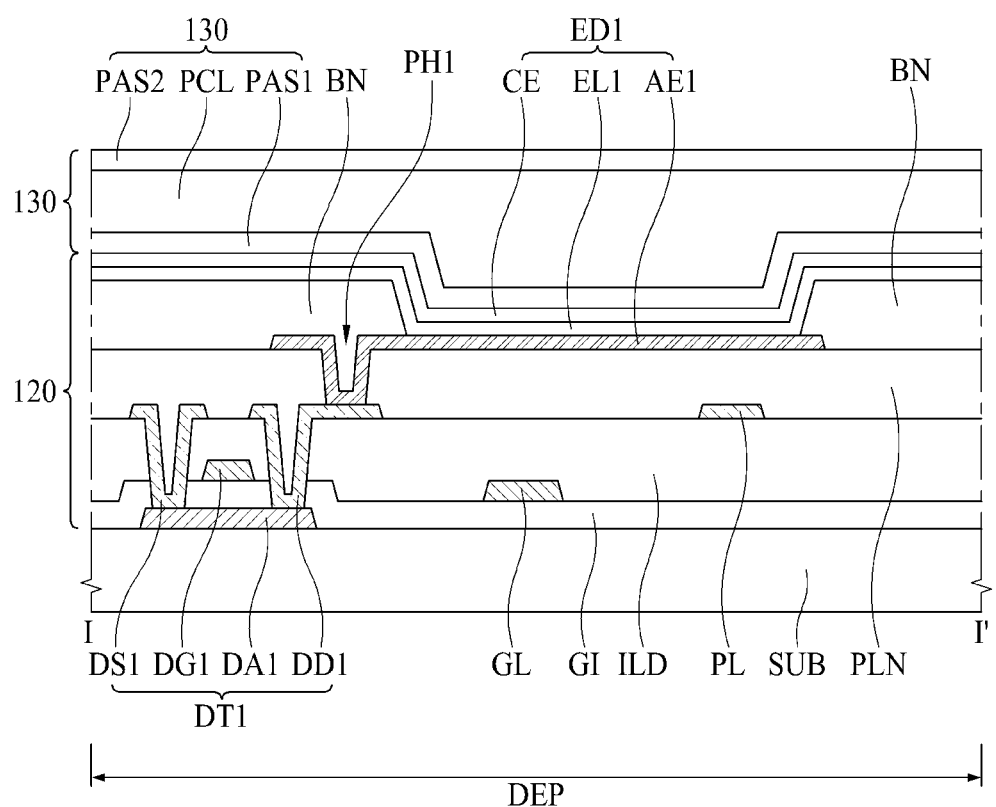
FIG. 3 is a sectional view taken along line I-I' in FIG. 2 and illustrating a structure of a driving emission pixel in the partial transparent EL display device according to the embodiment of the present disclosure.
Figure 4:
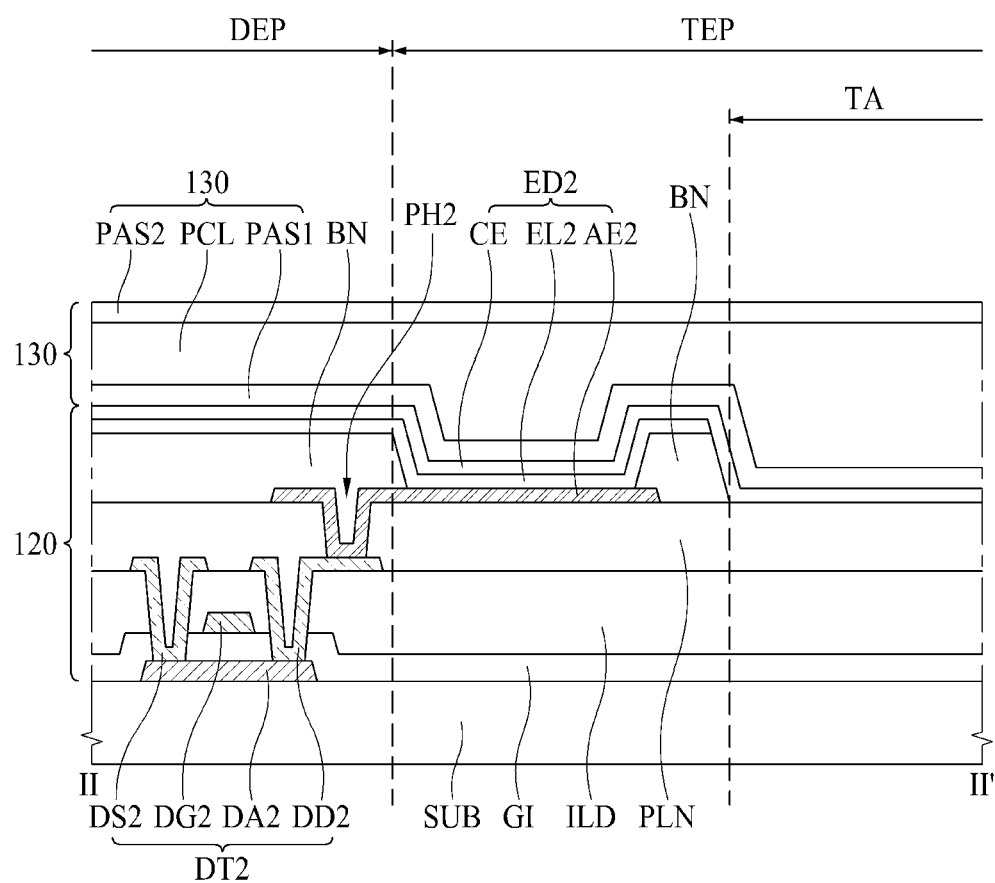
FIG. 4 is a sectional view taken along line II-II' in FIG. 2 and illustrating a structure of a transparent emission pixel in the partial transparent EL display device according to the embodiment of the present disclosure.

Referring to FIGS. 3 and 4, the EL display device according to an exemplary embodiment of the present disclosure includes a substrate SUB, a pixel array layer 120, and an encapsulation layer 130.

The substrate SUB includes a driving emission pixel DEP and a transparent emission pixel TEP. The substrate SUB is a base layer and is formed of a plastic material or a glass material. For example, the substrate SUB may be formed of an opaque or colored polyimide material. The substrate SUB may be a flexible board or a rigid board. For example, the flexible substrate SUB formed of a glass material may be a thin glass substrate with a thickness of 100 micrometers or less or may be a glass substrate which is etched to have a thickness of 100 micrometers or less through a substrate etching process.

A buffer film (not illustrated) is deposited on the top surface of the substrate SUB. The buffer film is formed on one surface of the substrate SUB to prevent moisture from permeating the pixel array layer 120 via the substrate SUB which is weak to moisture. For example, the buffer film may be formed of a plurality of inorganic films which are alternately stacked. For example, the buffer film may be formed of a multi-layered film in which one or more inorganic films of a silicon oxide film (SiOx), a silicon nitride film (SiNx), and SiON are alternately stacked. The buffer film may be omitted if necessary.

The pixel array layer 120 includes a thin-film transistor layer, a planarization layer PLN, a bank pattern BN, and light emitting elements ED1 and ED2.

For example, the thin-film transistor layer includes a first driving thin-film transistor DT1, a second driving thin-film transistor DT2, a gate insulating film GI, and an interlayer insulating film ILD. Here, the first driving thin-film transistor DT1 illustrated in FIG. 3 is electrically connected to a first light emitting element ED1 disposed in the driving emission pixel DEP. The second driving thin-film transistor DT2 illustrated in FIG. 4 is electrically connected to a second light emitting element ED2 disposed in the transparent emission pixel TEP.

The first driving thin-film transistor DT1 includes a first semiconductor layer DA1, a first gate electrode DG1, a first source electrode DS1, and a first drain electrode DD1 which are formed on the substrate SUB or the buffer film. The second driving thin-film transistor DT2 includes a second semiconductor layer DA2, a second gate electrode DG2, a second source electrode DS2, and a second drain electrode DD2 which are formed on the substrate SUB or the buffer film.

In the following description, the same constituent elements will be referred to as collective names. For example, the first gate electrode DG1 and the second gate electrode DG2 are also referred to as gate electrodes. In FIGS. 3 and 4, the driving thin-film transistors DT1 and DT2 have a top gate structure in which the gate electrodes DG1 and DG2 are located on the semiconductor layers DA1 and DA2, but the present disclosure is not limited thereto. For example, the driving thin-film transistors DT1 and DT2 may have a bottom gate structure in which the gate electrodes DG1 and DG2 are located under the semiconductor layers DA1 and DA2 or a double gate structure in which the gate electrodes DG1 and DG2 are located on and under the semiconductor layers DA1 and DA2.

The semiconductor layers DA1 and DA2 may be formed on the substrate SUB or the buffer film. The semiconductor layers DA1 and DA2 are formed of a silicon-based semiconductor material, an oxide-based semiconductor material, or an organic-based semiconductor material and have a single-layer structure or a multi-layer structure. A light blocking layer that blocks external light which is incident on the semiconductor layers DA1 and DA2 may be additionally formed between the buffer film and the semiconductor layers DA1 and DA2.

The gate insulating film GI is formed on the overall substrate SUB to cover the semiconductor layers DA1 and DA2. The gate insulating film GI is formed of an inorganic film such as a silicon oxide film (SiOx), a silicon nitride film (SiNx), or a multi-layered film thereof.

The gate electrodes DG1 and DG2 are formed on the gate insulating film GI to overlap the semiconductor layers DA1 and DA2. The gate electrodes DG1 and DG2 are formed along with the scan lines SL1 and SL2. For example, the gate electrodes DG1 and DG2 are formed of a single layer including one of molybdenum (Mo), aluminum (Al), chromium (Cr), gold (Au), titanium (Ti), nickel (Ni), neodymium (Nd), and copper (Cu) or an alloy thereof or multiple layers thereof.

The interlayer insulating film ILD is formed on the overall substrate SUB to cover the gate electrodes DG1 and DG2 and the gate insulating film GI. The interlayer insulating film ILD provides a flat surface to the gate electrodes DG1 and DG2 and the gate insulating film GI.

The source electrodes DS1 and DS2 and the drain electrodes DD1 and DD2 are formed on the interlayer insulating film ILD to overlap the semiconductor layers DA1 and DA2 with the gate electrodes DG1 and DG2 interposed therebetween. The source electrodes DS1 and DS2 and the drain electrodes DD1 and DD2 are formed along with the data line DL, the pixel driving power supply line PL, and the common power supply line CPL. That is, the source electrodes DS1 and DS2, the drain electrodes DD1 and DD2, the data line DL, the pixel driving power supply line PL, and the common power supply line CPL are formed through a process of patterning a source/drain electrode material at the same time.

The source electrodes DS1 and DS2 and the drain electrodes DD1 and DD2 are connected to the semiconductor layers DA1 and DA2 via electrode contact holes that penetrate the interlayer insulating film ILD and the gate insulating film GI. The source electrodes DS1 and DS2 and the drain electrodes DD1 and DD2 are formed of a single layer including one of molybdenum (Mo), aluminum (Al), chromium (Cr), gold (Au), titanium (Ti), nickel (Ni), neodymium (Nd), and copper (Cu) or an alloy thereof or multiple layers thereof. Here, the source electrodes DS1 and DS2 of the driving thin-film transistors DT1 and DT2 illustrated in FIGS. 3 and 4 are electrically connected to the pixel driving power supply line PL.

In this way, the second driving thin-film transistor DT2 provided in the driving emission pixel DEP of the substrate SUB constitutes a transparent emission pixel circuit PCT. The first driving thin-film transistor DT1 provided in the driving emission pixel DEP constitutes a driving emission pixel circuit PCD. On the other hand, the gate driving circuit 200 disposed in the fourth non-display area IA4 of the substrate SUB includes a thin-film transistor equal or similar to the driving thin-film transistors DT1 and DT2 provided in the driving emission pixel DEP.

The planarization layer PLN is formed on the overall substrate SUB to cover the thin-film transistor layer. The planarization layer PLN provides a flat surface on the thin-film transistor layer. For example, the planarization layer PLN is formed of an organic film such as an acryl resin, an epoxy resin, a phenolic resin, a polyamide resin, or a polyimide resin.

For example, the planarization layer PLN may include pixel contact holes PH1 and PH2 that expose the drain electrodes DD1 and DD2 of the driving thin-film transistors DT1 and DT2 provided in the driving emission pixel DEP.

The bank pattern BN is disposed on the planarization layer PLN and defines opening areas (or emission areas) in the transparent emission pixel TEP and the driving emission pixel DEP. The bank pattern BN may be referred to as a pixel defining film.

The first light emitting element ED1 includes a first pixel driving electrode AE1, a first light emitting layer EL1, and a common electrode CE. The first pixel driving electrode AE1 is formed on the planarization layer PLN and is electrically connected to the first drain electrode DD1 of the first driving thin-film transistor DT1 via the first pixel contact hole PH1 formed in the planarization layer PLN. In this case, the edge portion other than the middle portion of the first pixel driving electrode AE1 is covered by the bank pattern BN. The bank pattern BN covers the edge portion of the first pixel driving electrode AE1 to define the opening area of the driving emission pixel DEP.

The second light emitting element ED2 includes a second pixel driving electrode AE2, a second light emitting layer EL2, and a common electrode CE. The second pixel driving electrode AE2 is formed on the planarization layer PLN and is electrically connected to the second drain electrode DD2 of the second driving thin-film transistor DT2 via the second pixel contact hole PH2 formed in the planarization layer PLN. Particularly, the second pixel driving electrode AE2 is disposed in the transparent emission pixel TEP and thus is connected to the second drain electrode DD2 via the link electrode LK. In this case, the edge portion other than the middle portion of the second pixel driving electrode AE2 is covered by the bank pattern BN. The bank pattern BN covers the edge portion of the second pixel driving electrode AE2 to define the opening area of the transparent emission pixel TEP.

For example, the pixel driving electrodes AE1 and AE2 may be formed of a metal material having high reflectance. For example, the pixel driving electrodes AE1 and AE2 may be formed in a multilayered structure such as a stacked structure (Ti/Al/Ti) of aluminum (Al) and titanium (Ti), a stacked structure (ITO/Al/ITO) of aluminum (Al) and ITO, an APC alloy, and a stacked structure (ITO/APC/TIO) of an APC alloy and ITO or may be formed in a single-layered structure including one or an alloy of two or more selected from silver (Ag), aluminum (Al), molybdenum (Mo), gold (Au), magnesium (Mg), calcium (Ca), and barium (Ba).

The light emitting layers EL1 and EL2 are formed on the overall display area AA of the substrate SUB to cover the pixel driving electrodes AE1 and AE2 and the bank pattern BN. That is, the first light emitting layer EL1 and the second light emitting layer EL2 may be the same light emitting layer. For example, the light emitting layer EL may include two or more light emitting portions which are vertically stacked to emit white light. For example, the light emitting layer EL may include a first light emitting portion and a second light emitting portion for emitting white light by mixing first light and second light. Here, the first light emitting portion emits first light and includes a blue light emitting portion, a green light emitting portion, a red light emitting portion, a yellow light emitting portion, and a yellow-green light emitting portion. The second light emitting portion includes a light emitting portion that emits second light having a complementary color relationship with the first light out of the blue light emitting portion, the green light emitting portion, the red light emitting portion, the yellow light emitting portion, and the yellow-green light emitting portion.

For example, the light emitting layers EL1 and EL2 may include one of a blue light emitting portion, a green light emitting portion, and a red light emitting portion for emitting light of a color corresponding to a color set for the pixel P. When the first light emitting layer EL1 and the second light emitting layer EL2 emit light of different colors, the first light emitting layer EL1 and the second light emitting layer EL2 are formed of different organic materials and are independently formed for the pixel driving electrodes AE1 and AE2. For example, the light emitting layers EL1 and EL2 may include one of an organic light emitting layer, an inorganic light emitting layer, and a quantum-dot light emitting layer, or may have a stacked or mixed structure of an organic light emitting layer (or an inorganic light emitting layer) and a quantum-dot light emitting layer.

Additionally, the light emitting elements ED1 and ED2 may further include a functional layer for enhancing emission efficiency and/or lifespan of the light emitting layers EL1 and EL2.

The common electrode CE is formed to be electrically connected to the light emitting layers EL1 and EL2. The common electrode CE is formed in the overall display area AA of the substrate SUB to be commonly connected to the light emitting layers EL1 and EL2 provided in the pixels TEP and DEP.

For example, the common electrode CE may be formed of a transparent conductive material or a semi-transmissive conductive material that can transmit light. When the common electrode is formed of a semi-transmissive conductive material, emission efficiency of light emitted from the light emitting element ED can be enhanced by a microcavity structure. Examples of the semi-transmissive conductive material include magnesium (Mg), silver (Ag), and an alloy of magnesium (Mg) and silver (Ag). Additionally, a capping layer that adjusts a refractive index of light emitted from the light emitting element ED to enhance emission efficiency of light may be further formed on the common electrode CE.

The encapsulation layer 130 is formed to surround all the top surface and the side surface of the pixel array layer 120. The encapsulation layer 130 serves to prevent oxygen or moisture from permeating the light emitting elements ED1 and ED2.

For example, the encapsulation layer 130 includes a first inorganic encapsulation layer PAS1, an organic encapsulation layer PCL on the first inorganic encapsulation layer PAS1, and a second inorganic encapsulation layer PAS2 on the organic encapsulation layer PCL. The first inorganic encapsulation layer PAS1 and the second inorganic encapsulation layer PAS2 serve to prevent permeation of moisture or oxygen. For example, the first inorganic encapsulation layer PAS1 and the second inorganic encapsulation layer PAS2 may be formed of an inorganic material such as silicon nitride, aluminum nitride, zirconium nitride, titanium nitride, hafnium nitride tantalum nitride, silicon oxide, aluminum oxide, or titanium oxide. The first inorganic encapsulation layer PAS1 and the second inorganic encapsulation layer PAS2 can be formed through a chemical vapor deposition (CVD) process or an atomic layer deposition (ALD) process.

The organic encapsulation layer PCL has a structure in which it is sealed (surrounded) by the first inorganic encapsulation layer PAS1 and the second inorganic encapsulation layer PAS2. The organic encapsulation layer PCL is formed in a thickness greater than that of the first inorganic encapsulation layer PAS1 and/or the second inorganic encapsulation layer PAS such that particles which may be generated in the manufacturing process can be adsorbed and/or blocked. The organic encapsulation layer PCL may be formed of an organic material such as silicon oxycarbon (SiOCz) acryl or an epoxy-based resin. The organic encapsulation layer PCL can be formed using a coating process, for example, an ink-jet coating process or a slit coating process.

Referring back to FIG. 1, the EL display device according to an exemplary embodiment to the present disclosure further includes a dam structure DM. The dam structure DM is disposed in the non-display area IA of the substrate SUB such that flowing-over of the organic encapsulation layer PCL can be prevented.

For example, a dam structure DM may be disposed outside the display area AA. More specifically, the dam structure DM may be disposed outside the gate driving circuit 200 disposed outside the display area AA and the common power supply line CPL disposed outside the gate driving circuit 200. In some cases, the dam structure DM may be disposed to overlap the outer portion of the common power supply line CPL. In this case, it is possible to decrease a width of the non-display area IA in which the gate driving circuit 200 and the common power supply line CPL are disposed, thereby decreasing a bezel width.

Figure 5:
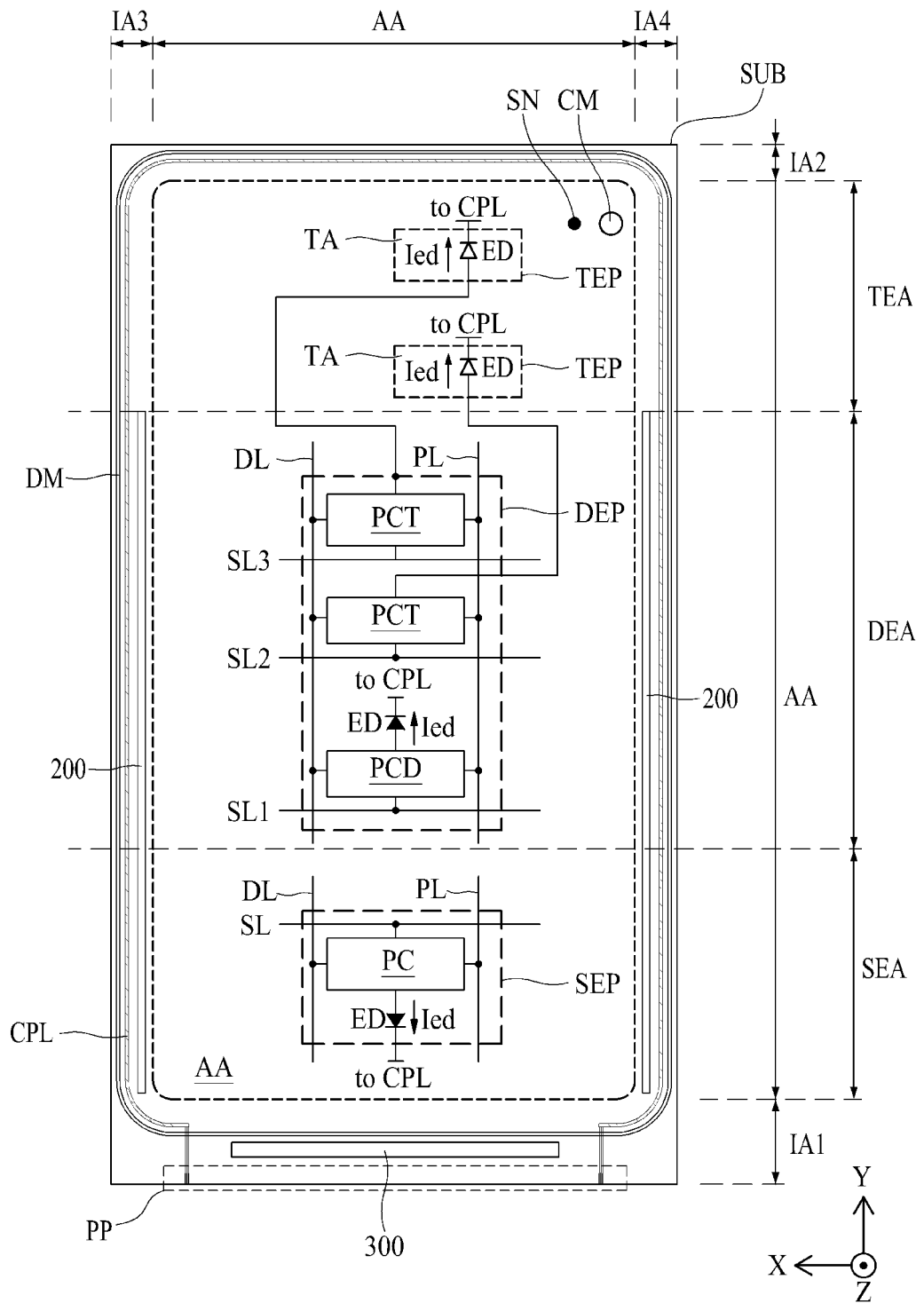
FIG. 5 is a plan view illustrating a partial transparent EL display device according to another embodiment of the present disclosure.
Figure 6:
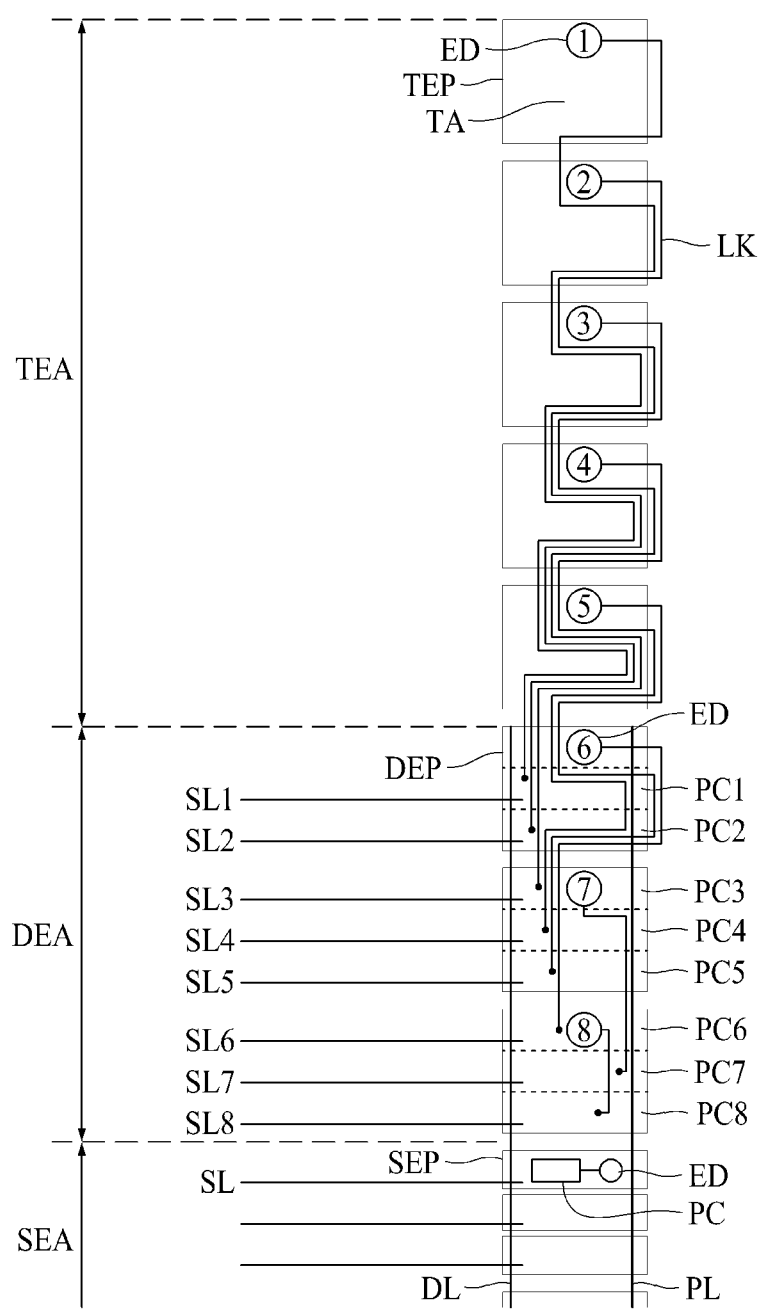
FIG. 6 is an enlarged plan view illustrating a structure of pixels disposed in a display area in the partial transparent EL display device according to the other embodiment of the present disclosure.

A partial transparent EL display device according to another exemplary embodiment of the present disclosure will be described below with reference to FIGS. 5 and 6. FIG. 5 is a plan view illustrating a partial transparent EL display device according to another embodiment of the present disclosure. FIG. 6 is an enlarged plan view illustrating a structure of pixels disposed in the display area in the partial transparent EL display device according to the other embodiment of the present disclosure. In the following description, description of the same reference signs and constituent components as described above with reference to FIGS. 1 to 4 will not be repeated unless it is necessary for the sake of brevity.

Referring to FIG. 5, the partial transparent EL display device according to another exemplary embodiment of the present disclosure includes a display area AA and non-display areas IA1, IA2, IA3, and IA4 surrounding the display area AA. The display area AA includes a transparent emission area TEA, a driving emission area DEA, and a standard emission area SEA.

In the transparent emission area TEA, a plurality of transparent emission pixels TEP are arranged in a matrix. In the driving emission area DEA, a plurality of driving emission pixels DEP are arranged in a matrix. In the standard emission area SEA, a plurality of standard emission pixels SEP are arranged in a matrix.

Each transparent emission pixel TEP includes one light emitting element ED and a transparent area TA surrounding the light emitting element ED. A driving emission pixel DEP includes two transparent emission pixel circuits PCTs and/or one driving emission pixel circuit PCD and one light emitting element ED. Each standard emission pixel SEP includes one standard pixel circuit PC and one light emitting element ED.

The transparent emission pixels TEP and the driving emission pixels DEP which are disposed in the transparent emission area TEA and the driving emission area DEA may have the same size and the same shape. On the other hand, the standard emission pixels SEP which are disposed in the standard emission area SEA may have a size of 1/n times the size of the transparent emission pixels TEP (where n is a natural number equal to or greater than 2).

For example, a driving emission pixel DEP is partitioned into three regions and pixel circuits are disposed in the ⅓ regions. Each driving emission pixel DEP includes one driving emission pixel circuit PCD and two transparent emission pixel circuits PCT. The one driving emission pixel circuit PCD is connected to one light emitting element ED which is disposed in the driving emission pixel DEP. The two transparent emission pixel circuits PCT are connected to two continuous transparent emission pixels TEP which are disposed in the transparent emission area TEA.

In this case, the standard emission pixel SEP has a size of ⅓ times the size of the driving emission pixel DEP. A standard pixel circuit PC and a light emitting element ED are disposed in the standard emission pixel SEP.

The pixel densities of the transparent emission area TEA and the driving emission area DEA are ⅓ times the pixel density of the standard emission area SEA. That is, the pixel density of the standard emission area SEA is three times.

In this configuration, a camera CM and/or an optical sensor SN is disposed in the rear surface of the transparent emission area TEA. Since light can pass through the substrate SUB via the transparent area TA of the transparent emission area TEA, external light can be sensed or an image can be captured by the camera through the transparent emission area TEA when the display function is not performed. When such an optical function is not performed, an image can be displayed using the light emitting elements ED.

Pixel circuits for driving the light emitting elements ED disposed in the transparent emission pixels TEP in addition to the driving emission pixels DEP are disposed in the driving emission area DEA. The driving emission area DEA has the same pixel density as the transparent emission area TEA and light emitting elements ED are disposed therein. Accordingly, the transparent emission area TEA and the driving emission area DEA can satisfactorily serve as a display area with a constant pixel density.

On the other hand, light emitting elements ED are disposed in the standard emission area SEA with a pixel density higher than that in the transparent emission area TEA and the driving emission area DEA. Accordingly, the standard emission area SEA can provide image information with a resolution higher than that in the transparent emission area TEA and the driving emission area DEA.

A specific example will be described below with reference to FIG. 6. For the purpose of convenience, only one pixel column is illustrated in FIG. 6. FIG. 6 illustrates an example in which the transparent emission area TEA is set in five pixel rows downward from the uppermost side of the display area AA, the driving emission area DEA is set in three pixel rows subsequent thereto, and the standard emission area SEA is set in the other rows. The present disclosure is not limited thereto and the transparent emission area TEA may be set in 20 pixel rows and the driving emission area DEA may be set in seven pixel rows.

In the transparent emission area TEA, five transparent emission pixels TEP are arranged continuously in the column direction. Five light emitting elements ED are disposed in the five transparent emission pixels TEP, respectively. In FIG. 6, circled numbers refer to the light emitting elements ED. The area of the transparent emission pixel TEP other than the light emitting element ED is defined as a transparent area TA.

In the driving emission area DEA, three driving emission pixels DEP are arranged continuously in the column direction. Three light emitting elements ED are disposed in the three driving emission pixels DEP, respectively. Three pixel circuits PC are disposed in one driving emission pixel DEP. Accordingly, eight pixel circuits PC1, . . . , PC8 are sequentially disposed in the driving emission area DEA. In FIG. 6, only two pixel circuits PC1 and PC2 are disposed in the driving emission pixel DEP disposed at the uppermost in the driving emission area DEA. This is because the number of pixel circuits and the area ratio of the pixel circuits may not match.

The pixel circuits PC1 to PC8 disposed in the driving emission area DEA are sequentially connected to the eight light emitting elements ED which are disposed in the transparent emission area TEA and the driving emission area DEA, respectively. For example, a first pixel circuit PC1 is connected to a first light emitting element ED1, a second pixel circuit PC2 is connected to a second light emitting element ED2, a third pixel circuit PC3 is connected to a third light emitting element ED3, a fourth pixel circuit PC4 is connected to a fourth light emitting element ED4, and a fifth pixel circuit PC5 is connected to a fifth light emitting element ED5, via link electrodes LK. A sixth pixel circuit PC6 is connected to a sixth light emitting element ED6, a seventh pixel circuit PC7 is connected to a seventh light emitting element ED7, and an eighth pixel circuit PC8 is connected to an eighth light emitting element ED8, via link electrodes LK.

The standard emission pixels SEP are disposed in the standard emission area SEA. Each standard emission pixel SEP has a size of ⅓ times the size of each driving emission pixel DEP. This size ratio is determined because the pixel circuits PC disposed in the display area AA may be formed with the same size. The reason for setting the sizes of the pixel circuits PC to be the same is that the driving elements have the same characteristics to decrease deviations in display quality.

One standard pixel circuit PC and one light emitting element ED are disposed in each standard emission pixel SEP. In this case, the standard emission area SEA has a pixel density of three times the pixel density of the transparent emission area TEA and the driving emission area DEA.

The pixel circuits PC are disposed in only the driving emission area DEA and the standard emission area SEA. That is, no pixel circuit PC may be disposed in the transparent emission area TEA. Accordingly, the scan lines SL, the data lines DL, and the pixel driving power supply lines PL which are connected to the pixel circuits PC are not disposed in the transparent emission area TEA.

The scan lines SL are connected to the gate driving unit 200 which is disposed in the third non-display area IA3 and/or the fourth non-display area IA4 which are disposed on the left side and/or the right side of the display area AA in FIG. 5. Accordingly, the gate driving unit 200 may not be formed on the left side and/or the right side of the transparent emission area TEA.

The data line DL and the pixel driving power supply line PL are connected commonly for one pixel column. The data line DL and the pixel driving power supply line PL extend from the pad part PP disposed in the first non-display area IA1 to the upper side of the display area AA and extends to only a boundary between the driving emission area DEA and the transparent emission area TEA.

With the above-mentioned structure, only the light emitting elements ED, the link lines LK, and the transparent areas TA are disposed in the transparent emission area TEA. Since lines including an opaque metal material such as the scan lines SL, the data lines DL, and the pixel driving power supply lines PL are not disposed in the transparent emission area TEA, transmittance of the transparent emission area TEA can be kept high.

In FIG. 6, a specific case in which five pixels out of eight pixels are disposed in the transparent emission area TEA and three pixels are disposed in the driving emission area DEA is illustrated. This can be generalized as follows.

In the display area AA on the substrate SUB, m (where m is a natural number) transparent emission pixels TEP are disposed sequentially downward in the column direction from the uppermost side. In addition, n (where n is a natural number equal to or less than m) driving emission pixels DEP are disposed sequentially downward in the column direction from the final driving emission pixel DEP. A plurality of standard emission pixels SEP are disposed sequentially downward in the column direction from the final driving emission pixel DEP. Each standard emission pixel SEP includes one pixel circuit PC and one light emitting element ED.

In the transparent emission pixels TEP and the driving emission pixels DEP, k (where k is a natural number of (m+n)) light emitting elements are disposed at constant intervals. Each of the m transparent emission pixels TEP includes a light emitting element ED and a transparent area TA surrounding the light emitting element ED. The k pixel circuits PC (or driving elements) are distributed and disposed in the n driving emission pixels DEP. The k pixel circuits PC are sequentially connected to the k light emitting elements ED.

It is preferable that the transparent emission pixels TEP and the driving emission pixels DEP have the same size and the same shape. The density of the standard emission pixels SEP disposed in the standard emission area SEA is higher than the density of the driving emission pixels DEP and the transparent emission pixels TEP disposed in the driving emission area DEA and the transparent emission area TEA. The size of each standard emission pixel SEP corresponds to an area which is occupied by one pixel circuit PC disposed in each driving emission pixel DEP The driving emission pixels DEP and the standard emission pixels SEP are defined by a plurality of scan lines SL, a plurality of data lines DL, and a plurality of pixel driving power supply lines PL. The k pixel circuits PC disposed in the transparent emission pixels TEP are connected to k continuous scan lines SL, the data line DL, and the pixel driving power supply line PL. Each of the standard pixel circuits PC is connected to one scan line SL other than the k scan lines, the data line DL, and the pixel driving power supply line PL.

The pad part PP is disposed in the first non-display area IA1 which is a non-display area close to the standard emission area SEA. That is, the pad part PP is disposed outside the lowermost standard emission pixel SEP in the column direction in which the standard emission pixels SEP are disposed. Data pads connected to the data lines DL and pixel driving power supply pads connected to the pixel driving power supply lines PL are disposed in the pad part PP. With this configuration, the data lines DL and the pixel driving power supply lines PL are not disposed in the transparent emission area TEA.

Accordingly, the driving emission pixels DEP and the standard emission pixels SEP are defined by the scan lines SL, the data lines DL, and the pixel driving power supply lines PL. On the other hand, the transparent emission pixels TEP are defined without disposing the scan lines SL, the data lines DL, and the pixel driving power supply lines PL. The transparent emission pixels TEP can be defined to correspond to the disposing type and the size of the driving emission pixels DEP.

The gate driving unit 200 is disposed on at least one side of the left side and the right side of the driving emission pixels DEP and the standard emission pixels SEP. The gate driving unit 200 is connected to the scan lines SL and sequentially supplies scan signals.

Figure 7:
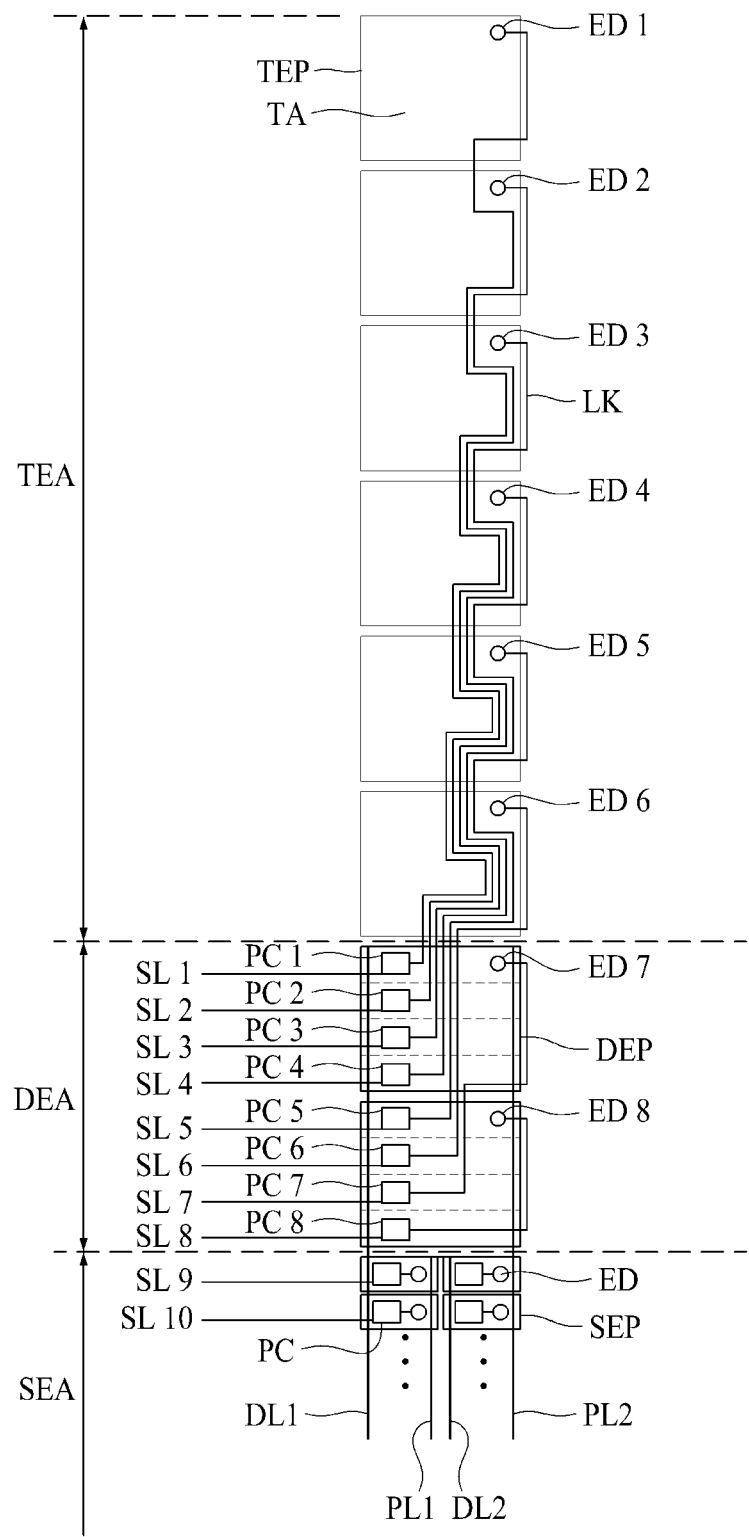
FIG. 7 is an enlarged plan view illustrating a structure of pixels disposed in a display area in a partial transparent EL display device according to still another embodiment of the present disclosure.

A partial transparent EL display device according to still another exemplary embodiment of the present disclosure will be described below with reference to FIGS. 5 and 7. FIG. 5 is a plan view illustrating a partial transparent EL display device according to another exemplary embodiment of the present disclosure. FIG. 7 is an enlarged plan view illustrating a structure of pixels which are disposed in a display area of the partial transparent EL display device according to still another exemplary embodiment of the present disclosure. In the following description, the same reference signs and the same elements as described above with reference to FIGS. 1 to 4 will not be repeatedly described unless necessary.

In the embodiment described with reference to FIG. 6, the transparent emission area TEA, the driving emission area DEA, and the standard emission area SEA are disposed in the column direction of a pixel array. Accordingly, the resolution of a low-resolution area including the transparent emission area TEA and the driving emission area DEA is 1/n times the resolution of a high-resolution area including the standard emission area SEA in the column direction. Here, n corresponds to the number of driving elements PC which are disposed in the driving emission pixels DEP disposed in the driving emission area DEA.

In the embodiment which will be described below with reference to FIG. 7, the resolution of a low-resolution area including the transparent emission area TEA and the driving emission area DEA is 1/n times the resolution of a high-resolution area including the standard emission area SEA in the column direction and the row direction. Hereinafter, it is assumed that two driving elements PC are disposed in the row direction and four driving elements PC are disposed in the column direction to satisfy n=8 in the driving emission pixels DEP of the driving emission area DEA.

Referring to FIGS. 5 and 7, the partial transparent EL display device according to another exemplary embodiment of the present disclosure includes a display area AA and non-display areas IA1, IA2, IA3, and IA4 surrounding the display area AA. The display area AA includes a transparent emission area TEA, a driving emission area DEA, and a standard emission area SEA.

In the transparent emission area TEA, a plurality of transparent emission pixels TEP are arranged in a matrix. In the driving emission area DEA, a plurality of driving emission pixels DEP are arranged in a matrix. In the standard emission area SEA, a plurality of standard emission pixels SEP are arranged in a matrix. The standard emission area SEA is defined as a high-density pixel area, and the transparent emission area TEA and the driving emission area DEA are defined as a low-density pixel area. For example, the pixel density of the low-density pixel area may be ⅛ times the pixel density of the high-density pixel area. Particularly, the high-density pixel area has a pixel density which is two times in the row direction and four times in the column direction of the pixel density of the low-density pixel area. In this case, the size of each transparent emission pixel TEP disposed in the transparent emission area TEA corresponds to the size of eight standard emission pixels SEP disposed in the standard emission area SEA. Similarly, the size of each driving emission pixel DEP disposed in the driving emission area DEA corresponds to the size of eight standard emission pixels SEP disposed in the standard emission area SEA.

For example, two driving emission pixels DEP may be disposed in the driving emission area DEA. One driving emission pixel DEP is partitioned into four regions, and one pixel circuit is disposed in each region such that total eight pixel circuits PC1, PC2, PC3, PC4, PC5, PC6, PC7 and PC8 are disposed. Since there are eight pixel circuits PC, eight light emitting elements ED1, ED2, ED3, ED4, ED5, ED6, ED7 and ED8 can be driven.

Accordingly, six light emitting elements ED1, ED2, ED3, ED4, ED5 and ED6 are disposed in the transparent emission area TEA and two light emitting elements ED7 and ED8 area are disposed in the driving emission area DEA. Since one light emitting element ED is disposed in one pixel, six transparent emission pixels TEP are disposed in the transparent emission area TEA and two driving emission pixels DEP are disposed in the driving emission area DEA.

In the standard emission area SEA, standard emission pixels SEP having a size corresponding to ⅛ times the pixel size in the transparent emission area TEA and the driving emission area DEA are disposed in a matrix. That is, the pixel density of the high-resolution area is eight times the pixel density of the low-resolution area. Each standard emission pixel SEP includes a pixel circuit PC and a light emitting element ED.

The link electrodes LK connected to the light emitting elements ED1, ED2, ED3, ED4, ED5 and ED6 disposed in the transparent emission area TEA are preferably biased to one side of a pixel row in the driving emission area DEA. For example, it is preferable that the link electrodes be biased and condensed to the right side of a pixel row as illustrated in FIG. 7. For this arrangement, the link electrodes LK bypass the light emitting elements ED1 to ED6 to surround them and progress in a zigzag track.

In this configuration, a camera CM and/or an optical sensor SN is disposed in the rear surface of the transparent emission area TEA. Since light can pass through the substrate SUB via the transparent area TA of the transparent emission area TEA, external light can be sensed or an image can be captured by the camera through the transparent emission area TEA when the display function is not performed. When such an optical function is not performed, an image can be displayed using the light emitting elements ED.

As illustrated in FIG. 7, the area occupied by the link electrodes LK increases downward in the column direction. Accordingly, the area occupied by the transparent area TA in the upper region in the transparent emission area TEA is much larger than the area occupied by the transparent area TA in the lower region. Accordingly, when an optical mechanism such as a camera is installed, the optical mechanism is preferably disposed to correspond to the upper region in which the area occupied by the link electrodes LK is small and the transparent area TA is wide.

Pixel circuits for driving the light emitting elements ED disposed in the transparent emission pixels TEP in addition to the driving emission pixels DEP are disposed in the driving emission area DEA. The light emitting elements ED are disposed with the same pixel density as in the transparent emission area TEA. Accordingly, the transparent emission area TEA and the driving emission area DEA can satisfactorily serve as a display area with a constant pixel density.

On the other hand, in the standard emission area SEA, the light emitting elements ED are disposed with a pixel density higher than that of the transparent emission area TEA and the driving emission area DEA. Accordingly, image information with a higher resolution than that in the transparent emission area TEA and the driving emission area DEA can be provided in the standard emission area SEA.

More specifically, in the driving emission area DEA, two driving emission pixels DEP are disposed continuous in the column direction. Accordingly, eight pixel circuits PC1 to PC8 are sequentially disposed in the driving emission area DEA.

The pixel circuits PC1 to PC8 disposed in the driving emission area DEA are sequentially connected to eight light emitting elements ED which are disposed in the transparent emission area TEA and the driving emission area DEA. For example, a first pixel circuit PC1 is connected to a first light emitting element ED1, a second pixel circuit PC2 is connected to a second light emitting element ED2, a third pixel circuit PC3 is connected to a third light emitting element ED3, a fourth pixel circuit PC4 is connected to a fourth light emitting element ED4, a fifth pixel circuit PC5 is connected to a fifth light emitting element ED5, via the link electrodes LK. A sixth pixel circuit PC6 is connected to a sixth light emitting element ED6, a seventh pixel circuit PC7 is connected to a seventh light emitting element ED7, and an eighth pixel circuit PC8 is connected to an eighth light emitting element ED8, via the link electrodes LK.

The standard emission pixels SEP are disposed in the standard emission area SEA. Each standard emission pixel SEP has a size of ⅛ times the size of each driving emission pixel DEP. This size ratio is determined because the pixel circuits PC disposed in the display area AA are formed with the same size. The reason for setting the sizes of the pixel circuits PC to be the same is that the driving elements have the same characteristics to decrease deviations in display quality.

Specifically, the scan lines are disposed with a uniform density in the driving emission area DEA and the standard emission area SEA. On the other hand, the data lines DL and the pixel driving power supply lines PL are disposed with a density of two times the density in the driving emission area DEA. For example, when i data lines DL and i pixel driving power supply lines PL are disposed in the standard emission area SEA, i/2 data lines DL and i/2 pixel driving power supply lines PL are disposed in the driving emission area DEA. In FIG. 7, the first data line DL1 and the second pixel driving power supply line PL2 are disposed in both the standard emission area SEA and the driving emission area DEA, and the second data line DL2 and the first pixel driving power supply line PL1 are disposed in only the standard emission area SEA. This represents that the first pixel driving power supply line PL1 and the second pixel driving power supply line PL2 are supplied with the same positive voltage. For example, the first pixel driving power supply line PL1 may extend to the driving emission area DEA and the second pixel driving power supply line PL may be disposed in only the standard emission area SEA.

Each standard emission pixel SEP includes one standard pixel circuit PC and one light emitting element ED. In this case, the standard emission area SEA has a pixel density which is higher eight times than the transparent emission area TEA and the driving emission area DEA.

The pixel circuits PC are disposed in only the driving emission area DEA and the standard emission area SEA. That is, the pixel circuits PC are not disposed in the transparent emission area TEA. Accordingly, the scan lines SL, the data lines DL, and the pixel driving power supply lines PL which are connected to the pixel circuits PC are also not disposed in the transparent emission area TEA.

With this structure, only the light emitting elements ED, the link electrodes LK, and the transparent areas TA are disposed in the transparent emission area TEA. Since lines including an opaque metal material such as the scan lines SL, the data lines DL, and the pixel driving power supply lines PL are not disposed in the transparent emission area TEA, transmittance of the transparent emission area TEA can be kept high.

In FIG. 7, the pixel density of the high-resolution area is eight times higher than the pixel density of the low-resolution area, but the present disclosure is not limited. The pixel density may be modified to various multiples such as four times, 12 times, and 16 times. In FIG. 7, two driving emission pixels DEP are disposed in the driving emission area DEA, but more driving emission pixels DEP can be disposed. In this case, the number of transparent emission pixels TEP disposed in the transparent emission area TEA increases further more.

The EL display device according to the embodiment of the present disclosure can be applied to various products such as a television, a notebook personal computer (PC), a monitor, a refrigerator, a microwave oven, a washing machine, and a camera in addition to mobile electronic devices such as an electronic notebook, an electronic book, a portable multimedia player (PMP), a navigation device, an ultra-mobile PC (UMPC), a smartphone, a mobile communication terminal, a mobile phone, a tablet PC, a smart watch, a watch phone, and a wearable device.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

The partial transparent display device according to the present disclosure includes a transparent emission area having a function of transmitting a background and a display function in a part of a display area. The other part of the display area has a display function and includes driving elements that drive light emitting elements disposed therein and light emitting elements disposed in the transparent emission area. Accordingly, even when a camera or light receiving elements are disposed on the rear surface of the transparent emission area, the area proportion of the display area can be increased because the transparent emission area has a display function. The partial transparent display device according to the present disclosure can be applied to various applications by configuring a part of a display area as a transparent display area and the other part as an opaque display area.

In addition to the above-mentioned advantageous effects of the present disclosure, other features and advantages of the present disclosure can be clearly understood by those skilled in the art from above description or explanation.

While embodiments of the present disclosure have been described above in detail in conjunction with the accompanying drawings, the present disclosure is not limited to the embodiments and can be modified and implemented in various forms without departing from the technical spirit of the present disclosure. Accordingly, the embodiments disclosed in the present disclosure are not for limiting the technical spirit of the present disclosure but for explaining it, and the scope of the technical spirit of the present disclosure is not limited by the embodiments. Therefore, the above-mentioned embodiments should be understood to be exemplary, not definitive, in all respects. The scope of the present disclosure should be defined by the appended claims, and all the technical spirits in equivalent ranges thereof should be construed to belong to the scope of the present disclosure.

What is claimed is:

1. A partial transparent display device comprising:
 a substrate;
 a transparent emission area disposed adjacent to one side of the substrate, wherein the transparent emission area includes transparent emission pixels; and
 a driving emission area disposed adjacent to the transparent emission area and closer to another side opposite to the one side of the substrate, wherein the driving emission area includes driving emission pixels;
 wherein a driving emission pixel includes:
 a first driving thin-film transistor connected to a first scan line, a corresponding data line, and a corresponding pixel driving power supply line;
 a second driving thin-film transistor connected to a second scan line, a corresponding data line, and a corresponding pixel driving power supply line; and
 a first light emitting element connected to the first driving thin-film transistor, and
 wherein a transparent emission pixel includes:
 a second light emitting element connected to the second driving thin-film transistor; and
 a transparent area that transmits light passing through the substrate.

2. The partial transparent display device according to claim 1, wherein the driving emission pixels have a same shape and size as the transparent emission pixels, and
 wherein the first light emitting element has a same shape and size as the second light emitting element.

3. The partial transparent display device according to claim 1, wherein the first light emitting element includes:
 a first pixel driving electrode connected to the first driving thin-film transistor; and
 a first light emitting layer stacked on the first pixel driving electrode,
 wherein the second light emitting element includes:
 a second pixel driving electrode connected to the second driving thin-film transistor; and
 a second light emitting layer stacked on the second pixel driving electrode, and
 wherein a common electrode is stacked on the first light emitting layer and the second light emitting layer.

4. The partial transparent display device according to claim 1, further comprising:
 a pad part that extends from the driving emission area and is disposed on the other side of the substrate,
 wherein the driving emission area includes the driving emission pixels which are defined by the first scan line and the second scan line, the data line, and the pixel driving power supply line, and
 wherein the transparent emission area includes the transparent emission pixels which are defined without the first scan line and the second scan line, the data line, and the pixel driving power supply line.

5. The partial transparent display device according to claim 4, wherein data lines including the data line and pixel driving power supply lines including the pixel driving power supply line extend from the driving emission area to the pad part, and
 wherein the pad part includes data pads connected to the data lines, and pixel driving power supply pads connected to the pixel driving power supply lines.

6. The partial transparent display device according to claim 4, wherein a gate driving unit connected to scan lines is further disposed on at least one side of a right side and a left side of the driving emission area.

7. The partial transparent display device according to claim 3, wherein the second light emitting element is connected to the second driving thin-film transistor by a connection electrode that extends from the second pixel driving electrode to the driving emission pixel.

8. The partial transparent display device according to claim 1, wherein the substrate is partitioned into a display area and a non-display area, and a dam structure is provided in the non-display area and has a closed curve structure surrounding the display area.

9. A partial transparent display device comprising:
 m transparent emission pixels (where m is a natural number) arranged in a column direction in one side of a substrate;
 n driving emission pixels (where n is a natural number equal to or less than m) arranged in the column direction to be adjacent to a final transparent emission pixel; and
 k light emitting elements (where k is a natural number equal to (m+n)) allocated to each of the transparent emission pixels and the driving emission pixels, respectively,
 wherein the m transparent emission pixels include transparent areas that are disposed around the light emitting elements of the transparent emission pixels,
 wherein k pixel circuits are distributed to and disposed in the n driving emission pixels, and
 wherein the k pixel circuits are sequentially connected to the k light emitting elements.

10. The partial transparent display device according to claim 9, wherein the transparent emission pixels and the driving emission pixels have a same size and shape.

11. The partial transparent display device according to claim 9, further comprising a plurality of standard emission pixels that are arranged in the column direction to be adjacent to a final driving emission pixel.

12. The partial transparent display device according to claim 11, wherein the standard emission pixels are disposed with a first pixel density, and
wherein each of the driving emission pixels and the transparent emission pixels are disposed with a second pixel density less than the first pixel density.

13. The partial transparent display device according to claim 12, wherein the first pixel density is two or more times the second pixel density in at least one direction of the column direction and a row direction which is perpendicular to the column direction.

14. The partial transparent display device according to claim 12, wherein each of the standard emission pixels includes one standard pixel circuit and one standard light emitting element, and
wherein the size of each of the standard emission pixel corresponds to an area occupied by one pixel circuit disposed in each driving emission pixel.

15. The partial transparent display device according to claim 11, wherein the driving emission pixels and the standard emission pixels are defined by a plurality of scan lines, a plurality of data lines, and a plurality of pixel driving power supply lines,
wherein the k pixels circuits are connected to k continuous scan lines of the plurality of scan lines, corresponding data lines, and corresponding pixel driving power supply lines, and
wherein each of the standard pixel circuits is connected one scan line other than the k continuous scan lines, a corresponding data line, and a corresponding pixel driving power supply line.

16. The partial transparent display device according to claim 15, further comprising:
a pad part that is disposed outside a final standard emission pixel in the column direction, and includes data pads connected to the data lines, and pixel driving power supply pads connected to the pixel driving power supply lines; and
a gate driving unit that is disposed on at least one side of a right side and a left side of the driving emission pixels and the standard emission pixels and is connected to the scan lines.

17. The partial transparent display device according to claim 11, wherein the standard emission pixels have a size of 1/p times the size of the transparent emission pixels (where p is a natural number equal to or greater than 2).

18. The partial transparent display device according to claim 9, further comprising link electrodes that link the pixel circuits and the light emitting elements,
wherein the link electrodes are disposed on one side of the transparent emission pixels to bypass and surround the light emitting elements.

19. The partial transparent display device according to claim 9, wherein the substrate is partitioned into a display area and a non-display area, and a dam structure is provided in the non-display area and has a closed curve structure surrounding the display area.

20. The partial transparent display device according to claim 19, wherein the pixel circuits disposed in the display area are formed with the same size.

* * * * *